United States Patent [19]

Kaise

[11] Patent Number: 4,564,806

[45] Date of Patent: Jan. 14, 1986

[54] TAUT BAND INSTRUMENT HAVING ACCURATE TAUT BAND POSITIONING MEANS

[75] Inventor: Hideo Kaise, Ueda, Japan

[73] Assignee: Kaise Denki Kabushiki Kaisha, Naganoken, Japan

[21] Appl. No.: 445,504

[22] Filed: Nov. 30, 1982

[30] Foreign Application Priority Data

Apr. 23, 1982 [JP] Japan .................................. 57-69288
Apr. 23, 1982 [JP] Japan .................................. 57-69289
Jun. 15, 1982 [JP] Japan .................................. 57-102686

[51] Int. Cl.⁴ ........................... G01R 1/08; G01R 5/02
[52] U.S. Cl. ............................ 324/154 PB; 324/154 R
[58] Field of Search ................... 324/150, 151, 154 R, 324/154 PB

[56] References Cited

U.S. PATENT DOCUMENTS

| 3,551,812 | 12/1970 | Mothes | 324/154 R X |
| 3,678,383 | 7/1972 | Boreas | 324/154 R |
| 4,024,472 | 5/1977 | Nador et al. | 324/154 R X |

FOREIGN PATENT DOCUMENTS

| 792902 | 8/1968 | Canada | 324/154 R |
| 232655 | 9/1944 | Fed. Rep. of Germany | 324/154 R |
| 2231657 | 5/1978 | Fed. Rep. of Germany | 324/154 PB |
| 54-73680 | 6/1979 | Japan | 324/154 R |
| 518759 | 3/1940 | United Kingdom | 324/154 R |
| 124529 | 12/1958 | U.S.S.R. | 324/154 R |

OTHER PUBLICATIONS

"A-C and D-C Full View Switch Board Instruments" Westinghouse, May 15, 1959, Catalog Section 43-240, p. 3.

Primary Examiner—Gerard R. Strecker
Assistant Examiner—Warren S. Edmonds
Attorney, Agent, or Firm—Birch, Stewart, Kolasch & Birch

[57] ABSTRACT

A taut band instrument having a moving coil hung by a pair of taut bands to measure electrical current and the like by way of rotating a moving coil in magnetic field. A pair of boss members are provided to hold the moving coil and the boss members include center holes and projections which are provided under the holes respectively, thereby positioning the taut bands at an accurate position. Balance of the moving portion is obtained by cutting off a part of an arm member belonging to the boss member which is made of synthetic resin to be an integral body.

2 Claims, 13 Drawing Figures

TAUT BAND INSTRUMENT HAVING ACCURATE TAUT BAND POSITIONING MEANS

BACKGROUND OF THE INVENTION

The present invention relates to a taut band instrument and more particularly to a taut band instrument in which the balance of the moving portion including a moving coil therein is obtained very easily and a taut band hanging the moving portion is secured accurately and quickly to a holder member.

In general, a moving portion rotating a needle of an electric instrument is hung by a body member to indicate a measured value accurately. For the purpose of the above, the moving portion should be kept in balance horizontally and be positioned at its center.

In a conventional taut band instrument, the moving portion comprises a moving coil, a band plate, and boss members. The moving coil is wound on a frame which is made of aluminum and, furthermore, the moving coil with the frame is mounted on the boss member. The boss member includes a cylindrical projection which is loosely inserted into a hole provided in a holder member. A taut band hanging the moving portion is fixed to the holder member at its end portion after passing through a passage provided in the cylindrical projection of the boss member. The boss member is usually made of phosophor bronze and the like and, when necessary, hide glue is added to an arm member which projects from the boss member in order to obtain weight balance for the moving portion. However, it is necessary to take much care for adjustment of the balance and, as a result, the construction of the boss member becomes complex.

Furthermore, in this construction, the taut band passes through the passage provided in the cylindrical projection. However, it is necessary to have much technical experience to fix the taut band accurately to the holder after being positioned at its center portion.

To overcome the above disadvantage, a pin member is applied to fix the taut band to the center portion in the boss member and a wedge is also adopted to fix the taut band to the center portion. However, according to this construction, the number of parts is increased and it is necessary to use a much more experienced technique to place the pin member. Furthermore, the wedge should be used to fixed the taut band onto the boss member so that workability is remarkably inefficient due to time consumption. Thus, it is necessary to take much care to assemble the parts and the process for making the instrument is complex.

SUMMARY OF THE INVENTION

It is a principal object of the present invention to provide a taut band instrument which has less parts than that of conventional instruments and is easy to manufacture.

It is another object of the present invention to provide a taut band instrument in which a boss member is simplified in construction and comprises synthetic resin to be an integral body to make balancing the moving portion easier.

It is a further object of the present invention to provide a taut band instrument in which a taut band is easily assembled at its accurately position to hang the moving portion.

It is another object of the present invention to provide a taut band instrument which is inexpensive to manufacture.

The foregoing and other objects, features and advantages of the invention will be apparent from the following more particular description of the preferred embodiments of the invention as illustrated in the accompanying drawings.

DETAILED DESCRIPTION OF THE INVENTION

Figure 1:
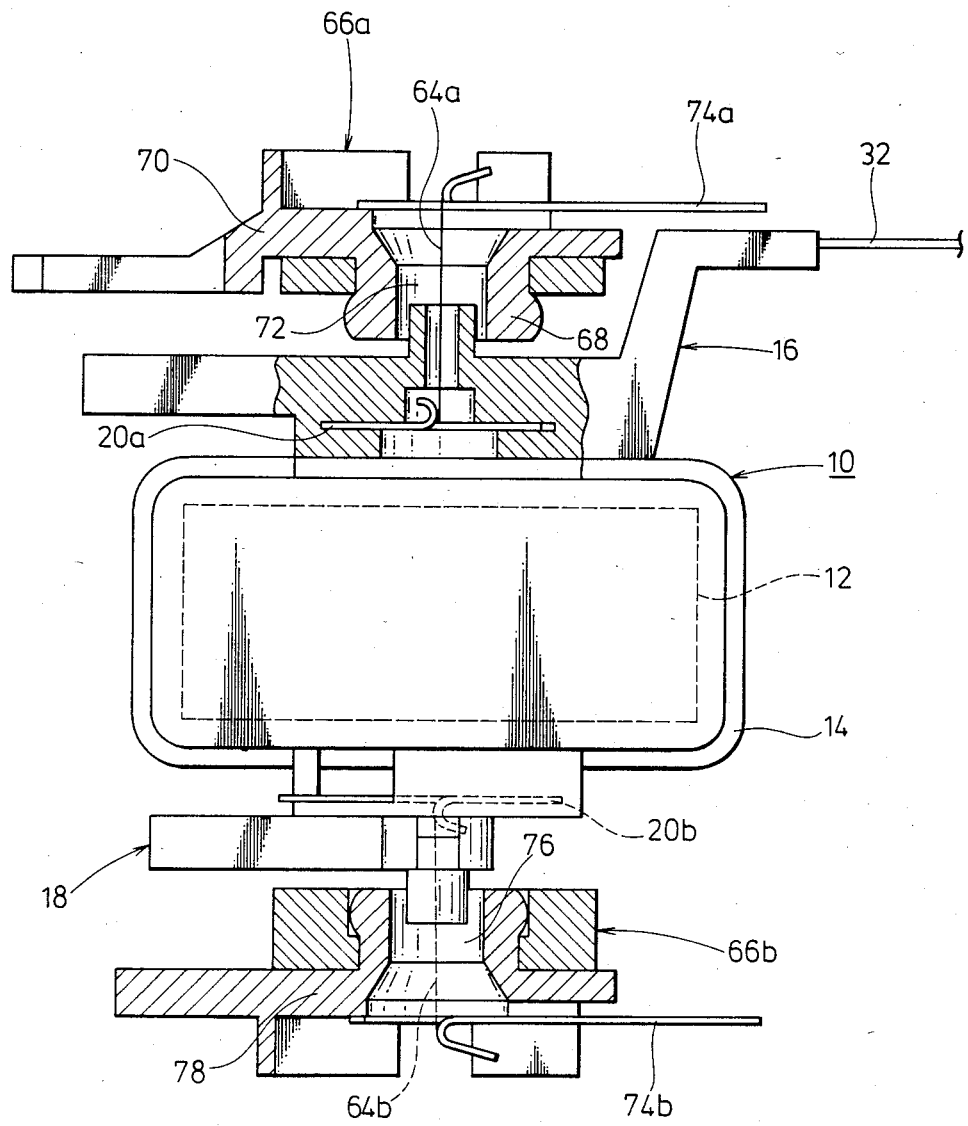
FIG. 1 is a front view of a taut band instrument according to the present invention of which a portion is cross-sectional.
Figure 2:
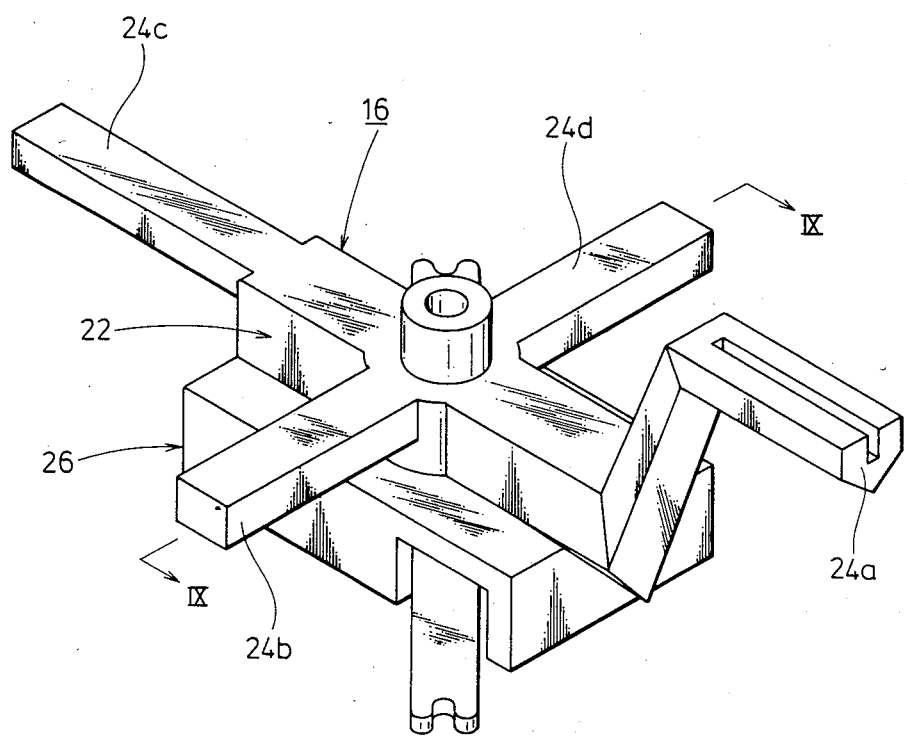
FIG. 2 is a perspective view of the first boss member of the taut band instrument.

In FIGS. 1 and 2 a moving portion 10 comprising a taut band instrument includes a moving coil 12 wound on a frame 14, the first boss member 16 supporting an upper portion of moving coil 12, the second boss member 18 supporting a lower portion of moving coil 12, and band plates 20a and 20b mounted on boss members 16 and 18, respectively. Frame 14 is made of aluminum and its configuration can be that conventional in the art.

Figure 3:
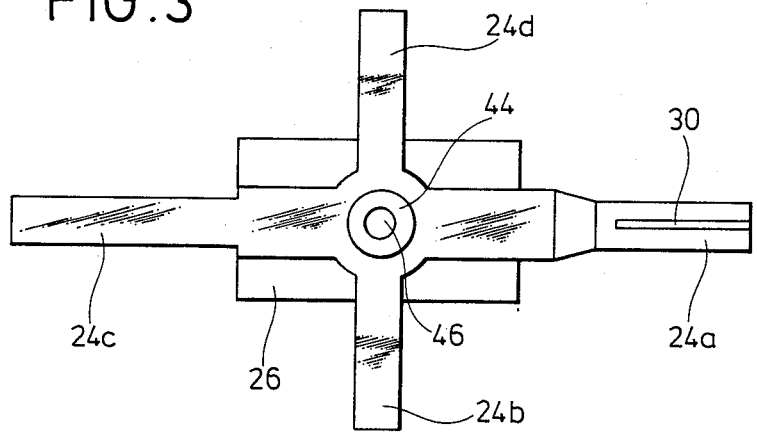
FIG. 3 is a plan view of the first boss member of the taut band instrument.
Figure 4:
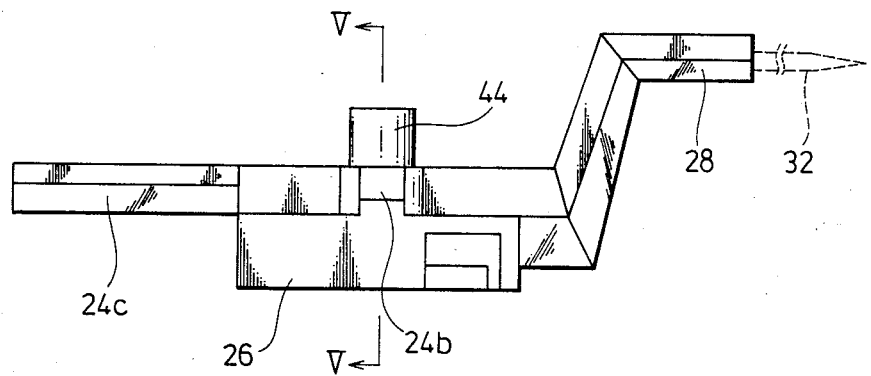
FIG. 4 is a front view of the base member and arm supporting portion of the taut band instrument.

An arm supporting portion 22 which include four (4) arm members 24a, 24b, 24c and 24d elongated therefrom horizontally and crosswise is provided at the upper center portion of a base member 26 comprising the first boss member 16. As shown in FIGS. 3 and 4, arm members 24b and 24d are relatively shorter than arm members 24a and 24c in length. Arm member 24a elongates horizontally to provide a horizontal portion 28 after standing upwardly at a predetermined angle.

A channel 30 is provided in horizontal portion 28 to secure a needle 32 which indicates a measured value.

Base member 26 which is rectangular includes a longitudinal channel 34 at its bottom portion to support frame 14 thereby providing a pair of projections 36a and 36b which are parallel with each other. Cutouts 38a and 38b are respectively provided in projections 36a and 36b at an angle of 45° to fix a band plate to base member 26 as illustrated hereinafter.

Figure 5:
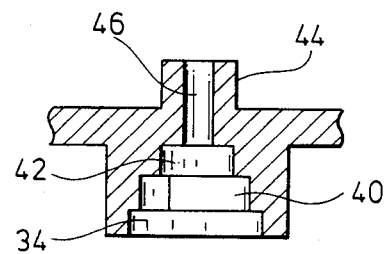
FIG. 5 is a sectional view taken along the line V—V in FIG. 4.
Figure 6:
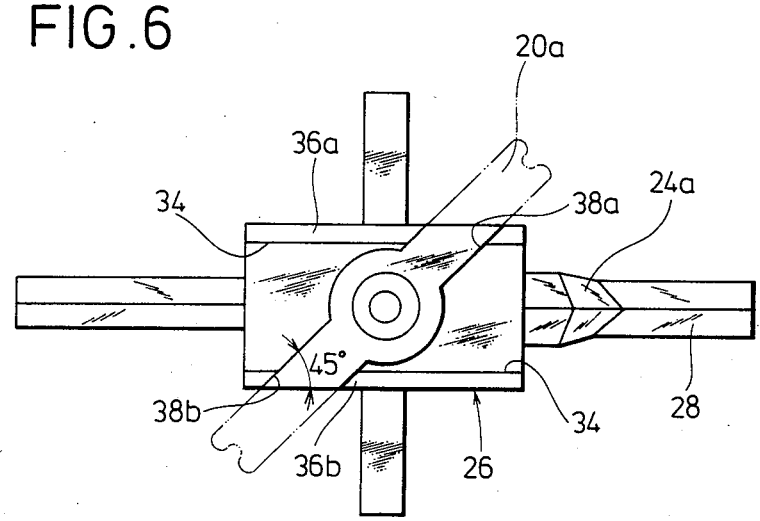
FIG. 6 is a bottom view of the first boss member of the taut band instrument.

The first cylindrical space 40 which is in communication with longitudinal channel 34 is provided at the center portion of base member 26 while the second cylindrical space 42 having smaller diameter than that of the first space 40 is provided on top of the first space 40. A cylindrical shaft 44 having a center hole 46 is provided at the upper surface of base member 26. Center hole 46 is in communication with the first cylindrical space 40 through the second cylindrical space 42 as shown in FIG. 5.

The second boss member 18 is a little different from the first boss member 16 in shape. An arm member corresponding to arm member 26a is not provided in the second boss 18 since it is unnecessary to secure meter needle 32 thereto. Thus in the second boss member 18, similar elements are numbered similar to those in the first boss member 16 except arm member 26a.

Figure 7:
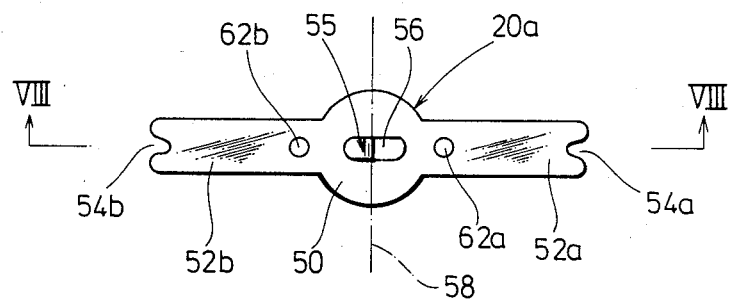
FIG. 7 is a plan view of a band plate which is assembled into the first boss member.
Figure 8:
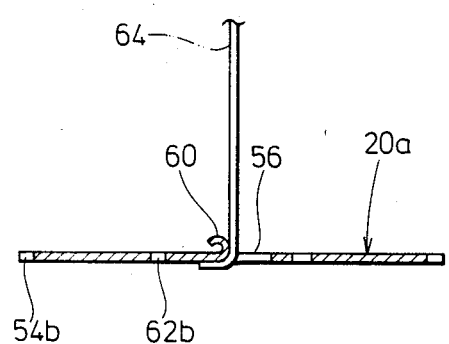
FIG. 8 is a sectional view taken along the line VIII—VIII in FIG. 7.

A band plate 20 is made of a plain metal plate. A center portion of band plate 20 is embossed to form a circular portion 50 from which arm portions 52a and 52b are elongated horizontally as shown in FIGS. 7 and 8. Arm portions 52a and 52b include recesses 54a and 54b at their respective end portions. A notch of a half oval type is provided to form a center hole 56 in a portion which is eccentric or off-set from the center line 58 of circular portion 50 (shown in FIG. 7). A piece produced by forming center hole 56 is wound along the center line 58 thereby providing a curling portion 60. In this configuration, a line of tangency of curling portion 60 which passes through center hole 56 should be located on the center line 58 accurately and also a surface of curling portion 60 should be smooth without any flaw. It is preferable to provide a pair of small holes 62a and 62b in arm portions 52a and 52b respectively as a mark in order to solder one end portion of a taut band 64 to arm 50a or 50b.

Moving portion 10 is held through taut bands 64a and 64b by a pair of holder 66a and 66b which are provided vertically. As apparent from FIG. 1, the first holder 66a includes a cylindrical projection 68 projecting downwardly from a body 70 so as to pass taut band 64a through a cylindrical space 72 defined in projection 68. Taut band 64a is pulled upwardly by means of a tension spring 74a fixed to the first holder 66a. Likewise, taut band 64b inserted into the second holder 66b is pulled downwardly by means of a tension spring 74b fixed to the second holder 66b. Thus, moving portion 10 is supported by a pair of taut bands 64a and 64b with elastic force at their opposite directions. Projection 68 is not provided in the second holder 66b unlike the first holder 66a. However, a cylindrical space 76 is provided in a body member 78 which is relatively thick so as to pass through taut band 64b which is elastically held by tension spring 74b.

In assembling of the above instrument, at first taut band 64 is secured to band plate 20. That is, one end of taut band 64 is soldered to band plate 20 at the middle point between small hold 62b and center hole 56 both of which are located on the line passing small hole 62a and 62b. The other end of taut band 64 is guided outside through space 42 and center hole 46.

Figure 9:
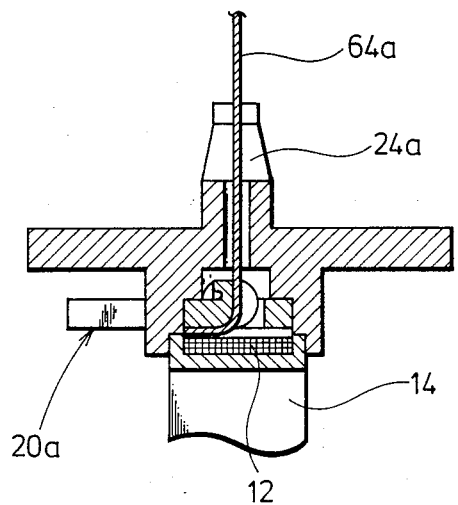
FIG. 9 is a sectional view taken along the line IX—IX in FIG. 2.

Taut band 64a is in contact with curling portion 60 so that taut band 64a can elongates upwardly along the line of tangency of curling portion 60. Thus, taut band 64 is positioned to pass through the center of center hole 46. Band plate 20a is mounted in the first cylindrical space 40 thereby positioning curling portion 60 within the second cylindrical space 42 (shown in FIG. 9). Base member 26 includes cutouts 38a and 38b which are eccentric approximately at an angle of 45° relative to longitudinal channel 30 so that band plate 20a is secured to base member 26 at an angle of 45° relative to the longitudinal direction thereof. Frame 14 supporting moving coil 12 is provided in longitudinal channel 34 as shown in FIG. 9.

As illustrated above, moving portion 10 is assembled with holders 66a and 66b to be an integral body by securing the outer ends of taut bands 64a and 64b to tension springs 74a and 74b respectively by using a conventional technique. Also, in a conventional manner, electricity is supplied into moving coil 12 through taut band 64 and be used to arrange a permanent magnet in suitable place. Furthermore, both members 16 and 18 are made of synthetic resin to be an integral body so that it is easy to obtain the balance of moving portion 10 by cutting off a portion of arm member 24a, 24b, 24c or 24d.

Figure 10:
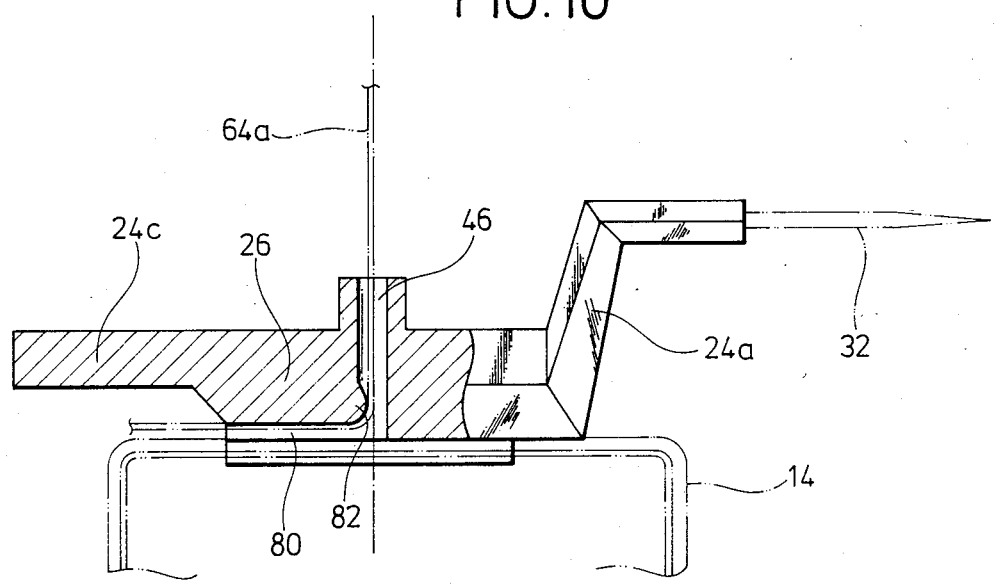
FIG. 10 is a front view of the first boss member of another embodiment according to the present invention.
Figure 11:
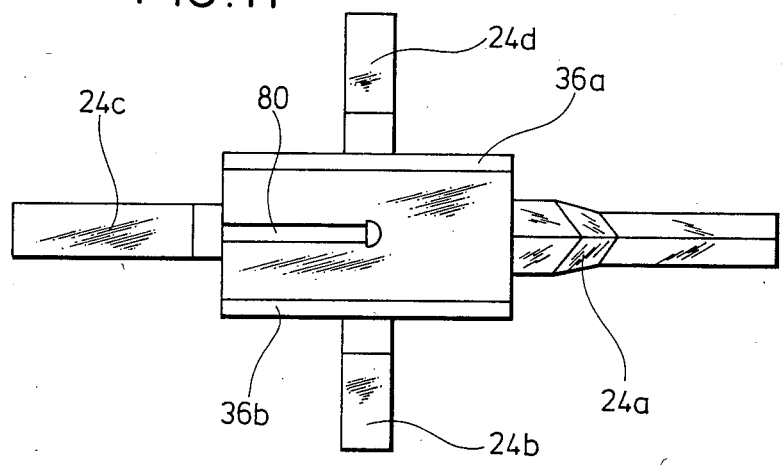
FIG. 11 is a bottom view of the first boss member shown in FIG. 10.

FIGS. 10 and 11 illustrate an alternate embodiment of the present invention wherein similar parts are numbered similar to those in FIGS. 1 to 8. In the embodiment, a channel 80 on top of longitudinal channel 34 is provided in base member 26 of the first boss member 16. Channel 80 elongates from the extremity of base member 26 to center hole 46 along the center line thereof.

An embossed portion 82 is formed at the corner provided between the lowest portion of center hole 46 and channel 80 as shown in FIG. 10. A portion 82 is embossed rounded. The line of tangency out of portion 82 should be located to be consistent with center line 58 accurately. A surface of embossed portion 82 is formed smooth without any flaw like that of curring portion 60.

In the above construction, the first boss member 16 can be made of synthetic resin to be an integral body so that it is possible to obtain substantially the balance of the first boss member 16 by using a metal mold for producing thereof. After that, the accurate balance of the first boss member 16 is obtained by way of scraping a predetermined part of arm member 26a, 26b, 26c and/or 26d.

In assembling moving portion 10, one end of taut band 64 is fixed into channel 80 whereas the other end is guided outside through center hole 46. A part of taut band 64 is in connection with embossed portion 82 so that the other end of taut band 64 passes through along the center line of center hole 46. Finally, the other end is secured to a tension spring (not shown).

In the above embodiment, it is unnecessary to assemble band plate 20 into the first boss member 16 and the construction of cylindrical shaft 44 is simplified because of reduction of space 40 and 42.

Figure 12:
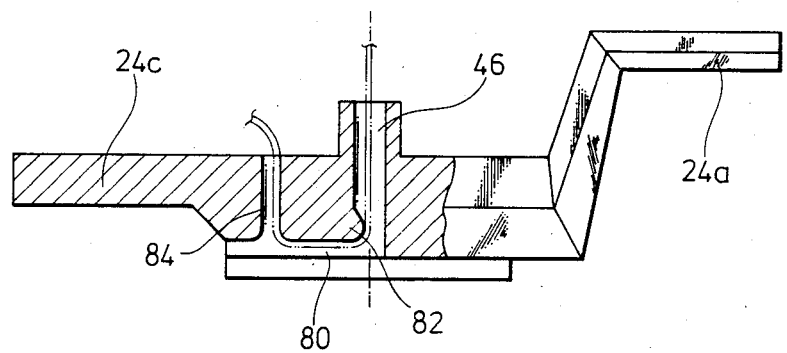
FIG. 12 is a front view of the first boss member of another embodiment according to the present invention.
Figure 13:
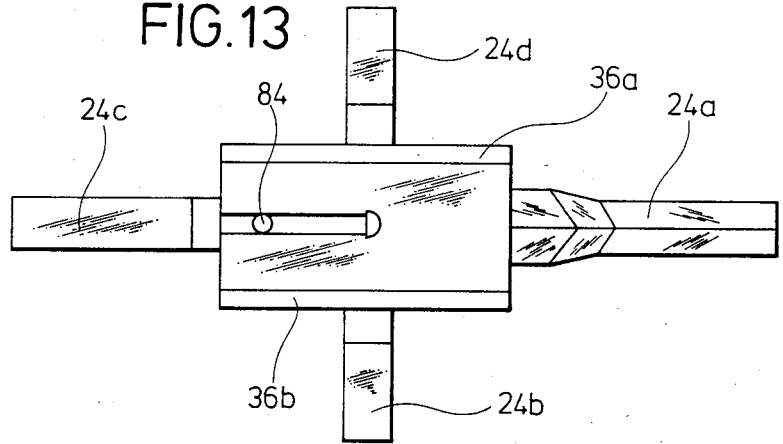
FIG. 13 is a bottom view of the first member shown in FIG. 12.

Furthermore, FIGS. 12 and 13 illustrates another embodiment of the present invention.

According to the embodiment, a hole 84 which elongates from the middle portion of channel 80 to the upper portion of arm supporting portion 22 is provided in the first boss member 16. One end portion of taut band 64 is fixed to the upper surface of arm supporting portion 22 whereas the other end passes through hole 84 being in connection with embossed portion 82 so as to be secured to a tension spring (not shown) through center hole 46.

In the embodiment, it is unnecessary to assemble band plate 20a into the first boss member 16 and working to secure one end of taut band 64 becomes easy since the working point is on the surface of arm supporting portion 22.

In all the embodiments of the above, electrical current is supplied to moving coil 12 to rotate moving portion 10 through taut bands 64 which are pulled by tension springs 74 respectively at its opposite direction thereby generating a magnetic field around moving portion 10. A magnetic attraction or repulsion occurs between moving coil 12 and a permanent magnet (not shown) so that needle 30 will be swung with an angle corresponding to a current intensity to indicate thereof.

According to the present invention, it is easy to manufacture taut band instruments and possible to make mass production of boss members because boss members are produced as an integral body by using synthetic resin. Furthermore, balance of a moving portion is easily performed by scraping a part of arm member. A taut is positioned accurately relative to the longitudinal direction of center hole without any discrepancy of its location because of the existence of a curring portion or embossed portion.

In the invention there is only a negligible discrepancy of position of the taut band relative to a crosswise direction of the center hole since the distance between center hole and small hole is so short and the width of the center hole is so narrow. In comparison with conventional taut band instruments, centering of the taut band is performed very easily and the number of parts thereof is remarkably reduced according to the present invention.

While the invention has been particularly shown and described with respect to a preferred embodiment thereof, it will be understood by those in the art that various changes in form and detail may be made therein without departing from the spirit and scope of the invention. For example, an embossed portion can be provided at any portion provided that taut band is located on the center line of center hole.

What is claimed is:

1. A taut band instrument, comprising:
   a moving means including a moving coil mounted on a frame means,
   a first boss means for supporting an upper portion of said moving coil and having a center hole therein forming an inner wall of said first boss means;
   a second boss means for supporting a lower portion of said moving coil and having a center hole therein forming an inner wall of said second boss means;
   first and second taut bands for hanging said moving means and being positioned in said center holes of said first and second boss means, respectively; and
   at least one of said boss means including a first channel at the bottom thereof for holding said moving means, a second channel being in communication with said first channel whereby one end of said taut band is fixed within said second channel, and a projection formed in a portion of said inner wall of said boss means projecting into said center hole, said taut band being accurately positioned within said center hole of said boss means by being positioned in contact with said projection.

2. An instrument according to claim 1, wherein said boss means includes a first channel at its bottom portion to hold said moving means, and a second channel which is in communication with said first channel and a hole which elongates vertically from a surface of said boss means to said second channel thereby passing said taut band outside through said vertical hole, said second channel and said center hole.

* * * * *